(12) United States Patent
Tajiri

(10) Patent No.: US 9,171,945 B2
(45) Date of Patent: Oct. 27, 2015

(54) SWITCHING ELEMENT UTILIZING RECOMBINATION

(75) Inventor: Masayuki Tajiri, Osaka (JP)

(73) Assignee: Sharp Kabushiki Kaisha, Osaka-shi, Osaka (JP)

( * ) Notice: Subject to any disclaimer, the term of this patent is extended or adjusted under 35 U.S.C. 154(b) by 0 days.

(21) Appl. No.: 14/119,934

(22) PCT Filed: Apr. 2, 2012

(86) PCT No.: PCT/JP2012/058859
§ 371 (c)(1),
(2), (4) Date: Nov. 25, 2013

(87) PCT Pub. No.: WO2012/160875
PCT Pub. Date: Nov. 29, 2012

(65) Prior Publication Data
US 2014/0084346 A1    Mar. 27, 2014

(30) Foreign Application Priority Data

May 25, 2011    (JP) .................................. 2011-116906

(51) Int. Cl.
*H01L 29/778*    (2006.01)
*H01L 29/20*    (2006.01)
(Continued)

(52) U.S. Cl.
CPC .......... *H01L 29/778* (2013.01); *H01L 29/2003* (2013.01); *H01L 29/205* (2013.01);
(Continued)

(58) Field of Classification Search
CPC ............................. H01L 29/778; H01L 29/205
USPC ........................................................ 257/194
See application file for complete search history.

(56) References Cited

U.S. PATENT DOCUMENTS

2006/0102929 A1    5/2006    Okamoto et al.
2007/0196993 A1    8/2007    Iwakami et al.
(Continued)

FOREIGN PATENT DOCUMENTS

JP    2002-359256    12/2002
JP    2004-200248    7/2004
(Continued)

OTHER PUBLICATIONS

Hu, Chenming Calvin; Modern Semiconductor Devices for Intergrated Circuits; Dec. 2009; Chapter 2, p. 51, paragraph 1.*

(Continued)

*Primary Examiner* — Michael Jung
*Assistant Examiner* — Charles R Peters
(74) *Attorney, Agent, or Firm* — Nixon & Vanderhye, P.C.

(57) ABSTRACT

Provided is a switching element capable of effectively preventing a collapse phenomenon. A switching element (1a) includes an electron running layer (12), an electron supplying layer (13) formed on an upper surface of the electron running layer (12), having a band gap larger than that of the electron running layer (12), and forming a heterojunction with the electron running layer (12), a recombination layer (17) formed on an upper surface of the electron supplying layer (13) and having a band gap smaller than that of the electron supplying layer (13), a source electrode (14) and a drain electrode (15) at least partially formed on the upper surface of the electron running layer (12), and a gate electrode (16) at least partially formed on the upper surface of the electron supplying layer (13) and arranged between the source electrode (14) and the drain electrode (15). When the switching element (1a) is in an off state, electrons and holes are recombined in the recombination layer (17).

11 Claims, 9 Drawing Sheets

(51) Int. Cl.
*H01L 29/417* (2006.01)
*H01L 29/423* (2006.01)
*H01L 29/66* (2006.01)
*H01L 29/205* (2006.01)

(52) U.S. Cl.
CPC .... *H01L29/41725* (2013.01); *H01L 29/42316* (2013.01); *H01L 29/66462* (2013.01); *H01L 29/7787* (2013.01)

(56) References Cited

U.S. PATENT DOCUMENTS

2010/0301307 A1* 12/2010 Fattal et al. .................. 257/13
2011/0215379 A1* 9/2011 Ikoshi et al. .................. 257/194
2011/0253975 A1* 10/2011 Shatalov et al. .............. 257/13

FOREIGN PATENT DOCUMENTS

| | | |
|---|---|---|
| JP | 2007-208036 | 8/2007 |
| JP | 2007-251144 | 9/2007 |
| JP | 2009-32713 | 2/2009 |
| JP | 2010-182854 | 8/2010 |
| WO | WO 2010/064362 * 6/2010 | ........ H01L 29/42316 |

OTHER PUBLICATIONS

International Search Report for PCT/JP2012/058859 mailed Jun. 5, 2012.

* cited by examiner

SWITCHING ELEMENT UTILIZING RECOMBINATION

CROSS-REFERENCE TO RELATED APPLICATIONS

This application is a National Phase filing under 35 U.S.C. §371 of International Application No. PCT/JP2012/058859 filed on Apr. 2, 2012, and which claims priority to Japanese Patent Application No. 2011-116906 filed on May 25, 2011.

TECHNICAL FIELD

The present invention relates to a switching element represented by a HEMT (High Electron Mobility Transistor) or the like.

BACKGROUND ART

Recently, a nitride semiconductor serving as a group III-V compound semiconductor represented by GaN is expected to be applied to a switching element. Especially, as for the nitride semiconductor, compared with silicon, its band gap is as large as 3.4 eV, its breakdown electric field is 10 times higher, and its electron saturation speed is 2.5 times faster, so that it has characteristics suitable for a power device.

More specifically, a switching element having a heterostructure of GaN/AlGaN on a sapphire substrate or the like has been proposed, for example (refer to a Patent Document 1, for example). As for this switching element, two-dimensional electron gas (2DEG) of no fewer than $1 \times 10^{13}$ cm$^{-2}$ can be generated due to spontaneous polarization caused by asymmetry of a GaN crystal structure (wurtzite type) in a C axis direction, and polarization provided by a piezo effect resulting from lattice mismatch of AlGaN and GaN. This switching element switches conducting state/non-conducting state between predetermined electrodes by controlling this two-dimensional electron gas.

The switching element having the above structure will be described specifically with reference to FIGS. 6 to 8. FIG. 6 is a cross-sectional view showing a structure of a conventional switching element. FIG. 7 is a cross-sectional view showing an off state of the conventional switching element shown in FIG. 6. FIG. 8 is a cross-sectional view showing an on state of the conventional switching element shown in FIG. 6.

As shown in FIG. 6, a switching element 100 includes a substrate 101, a buffer layer 102 formed on an upper surface of the substrate 101, an electron running layer 103 formed on an upper surface of the buffer layer 102 and composed of undoped GaN, an electron supplying layer 104 formed on an upper surface of the electron running layer 103 and composed of AlGaN, a source electrode 105 formed on an upper surface of the electron supplying layer 104, a drain electrode 106 formed on the upper surface of the electron supplying layer 104, and a gate electrode 107 formed on the upper surface of the electron supplying layer 104 and arranged between the source electrode 105 and the drain electrode 106. In addition, the switching element 100 is a normally-on type.

As for the switching element 100, when a potential of the gate electrode 107 is equal to a potential (set to 0 V) of the source electrode 105, or the gate electrode 107 is open, it is switched to a state (on state) in which two-dimensional electron gas 108 is generated in an interface of the electron running layer 103 with the electron supplying layer 104. At this time, when a potential of the drain electrode 106 is higher than the potential of the source electrode 105 (when it is a positive potential), a current flows between the drain electrode 106 and the source electrode 105.

Meanwhile, as for the switching element 100, when the potential of the gate electrode 107 is lower than the potential (set to 0 V) of the source electrode 105 by a predetermined value or more (when it is a negative potential), it is switched to a state (off state) in which the two-dimensional electron gas 108 is not generated in the interface of the electron supplying layer 104 with the electron running layer 103, just below the gate electrode 107. In this state, a current does not flow between the drain electrode 106 and the source electrode 105.

As shown in FIG. 7, when the switching element 100 is switched to the off state, a depletion region 109 is formed just below the gate electrode 107. At this time, as for the switching element 100 for the power device, a high potential difference (about several hundred V corresponding to a power supply voltage, for example) is generated between the drain electrode 106 and the source electrode 105. As a result, a high electric field is generated in the vicinity of the gate electrode 107 on the drain electrode 106 side, and electrons and holes are generated due to impact ionization. Thus, the generated electrons 110 are trapped in a level such as a level caused by a nitrogen defect in the surface (upper surface) of the electron supplying layer 104.

When the switching element 100 is switched from the off state shown in FIG. 7 to the on state, as shown in FIG. 8, the electrons 110 trapped in the surface of the electron supplying layer 104 are held for a predetermined time (as long as several seconds to several minutes, for example). The electron 110 exerts a repulsive force (Coulomb force) on an electron in the two-dimensional electron gas 108, and prevents the current from flowing between the drain electrode 106 and the source electrode 105. This is a phenomenon called a "collapse phenomenon", and on-resistance of the switching element 100 is increased due to this phenomenon, so that high-speed switching is difficult to perform, which is a problem.

A structure to prevent this collapse phenomenon is disclosed in a Patent Document 2. This structure will be described with reference to FIG. 9. FIG. 9 is a cross-sectional view showing a structure of a conventional switching element.

As shown in FIG. 9, a switching element 200 includes a substrate 201, a buffer layer 202 formed on an upper surface of the substrate 201, an electron running layer 203 formed on an upper surface of the buffer layer 202 and composed of undoped GaN, an electron supplying layer 204 formed on an upper surface of the electron running layer 203 and composed of AlGaN, a source electrode 205 partially formed on the upper surface of the electron running layer 203, a drain electrode 206 partially formed on the upper surface of the electron running layer 203, a gate electrode 207 formed on the upper surface of the electron supplying layer 204 and arranged between the source electrode 205 and the drain electrode 206, and a passivation layer 211 formed on the upper surface of the electron supplying layer 204, and arranged between the gate electrode 207 and the source electrode 205 and between the gate electrode 207 and the drain electrode 206.

As for this switching element 200, since the passivation layer 211 composed of nitride is provided on the upper surface of the electron supplying layer 204, a nitrogen defect is prevented from being generated in the surface (upper surface) of the electron supplying layer 204. In addition, since the switching element 200 has a structure (field plate structure) in which the gate electrode 207 extends at least toward the drain electrode 206, an electric field is reduced from being generated in the vicinity of the gate electrode 207 on the drain electrode 206 side, so that the above-described impact ionization is prevented from being generated.

PRIOR ART DOCUMENT

Patent Document

Patent Document 1: JP 2007-251144 A
Patent Document 2: JP 2004-200248 A

SUMMARY OF THE INVENTION

Problems to be Solved by the Invention

However, even when the passivation layer 211 is employed, the number of the compensated nitrogen defects remains at a one-digit level. In addition, when the voltage as high as several hundred V is applied like in the switching element for the power device, the impact ionization is difficult to sufficiently prevent only by employing the gate electrode 207 having the field plate structure. Therefore, as for the switching element 200 shown in FIG. 9, the collapse phenomenon cannot be sufficiently prevented, which is a problem. More specifically, when the switching element 200 is switched from an off state to an on state, its on-resistance reaches a value several times as high as an initial state after several µ seconds of the switching operation, so that enough improvement cannot be produced, which is the problem.

In view of the above problems, it is an object of the present invention to provide a switching element capable of effectively preventing the collapse phenomenon.

Means for Solving the Problem

To solve the problem, the present invention includes a first semiconductor layer;
a second semiconductor layer formed on an upper surface of the first semiconductor layer, having a band gap larger than that of the first semiconductor layer, and forming a heterojunction with the first semiconductor layer;
a third semiconductor layer formed on an upper surface of the second semiconductor layer and having a band gap smaller than that of the second semiconductor layer;
a first electrode having at least one part formed on the upper surface of the first semiconductor layer;
a second electrode having at least one part formed on the upper surface of the first semiconductor layer; and
a control electrode having at least one part formed on the upper surface of the second semiconductor layer and arranged between the first electrode and the second electrode, wherein
the switching element is switched, depending on a potential of the control electrode, between
 an on state in which the first electrode and the second electrode are electrically connected through a two-dimensional carrier gas generated in an interface of the first semiconductor layer with the second semiconductor layer, and
 an off state in which the first electrode and the second electrode are not electrically connected as no two-dimensional carrier gas is generated in the interface, at least just below the control electrode, and
 recombination of electrons and holes is made in the third semiconductor layer when the off state is provided In addition, it is preferable that, in the switching element having the above characteristic, the third semiconductor layer is formed at least one of a position between the control electrode and the first electrode, and a position between the control electrode and the second electrode.

In addition, it is preferable that, in the switching element having the above characteristics, radiative recombination of the electrons and the holes is made between the electron and the hole in the third semiconductor layer when the off state is provided.

In addition, it is preferable that, in the switching element having the above characteristics, each of the first semiconductor layer, the second semiconductor layer, and the third semiconductor layer is composed of a nitride semiconductor, the two-dimensional carrier gas is a two-dimensional electron gas, and
the third semiconductor layer contains indium.

In addition, it is preferable that, in the switching element having the above characteristics, the third semiconductor layer is composed of $In_xAl_yGa_{1-x-y}N$ ($0<x\le1$, $0\le y\le1$).

In addition, it is preferable that, in the switching element having the above characteristics, the third semiconductor layer has a multiple quantum well structure in which at least two nitride semiconductor layers having different indium compositions are laminated periodically.

In addition, it is preferable that, in the switching element having the above characteristics, the third semiconductor is formed in such a manner that a layer composed of a predetermined nitride semiconductor is formed on the upper surface of the second semiconductor layer, and then indium ion is implanted to the layer.

In addition, it is preferable that the switching element having the above characteristics further includes a fourth semiconductor layer formed on an upper surface of the third semiconductor layer and having a band gap larger than that of the third semiconductor layer.

In addition, it is preferable that, in the switching element having the above characteristics, the fourth semiconductor layer is composed of $Al_zGa_{1-z}N$ ($0\le z<1$).

In addition, it is preferable that the switching element having the above characteristics further includes an insulating layer formed on an upper surface of the fourth semiconductor layer and having a band gap larger than that of the fourth semiconductor layer.

In addition, it is preferable that, in the switching element having the above characteristics, the insulating layer is composed of AlN or SiN.

In addition, it is preferable that, in the switching element having the above characteristics, the insulating layer is formed in a space obtained by separating the third semiconductor layer and the fourth semiconductor layer from each of the control electrode, the first electrode, and the second electrode.

Effect of the Invention

According to the switching element having the above characteristics, since the third semiconductor layer is provided, electric charges (especially, carriers) generated due to the impact ionization can be prevented from being trapped on the surface (upper surface) of the second semiconductor layer. That is, the collapse phenomenon can be effectively prevented.

MODE FOR CARRYING OUT THE INVENTION

Hereinafter, switching elements according to first to third embodiments of the present invention will be described with reference to the drawings. In addition, each of the switching elements according to the first to third embodiments which will be described below is only one embodiment of the present invention, and the present invention is not limited to them. Furthermore, one or all parts of the switching elements according to the first to third embodiments can be combined and implemented as long as there is no discrepancy.

First Embodiment

Figure 1:
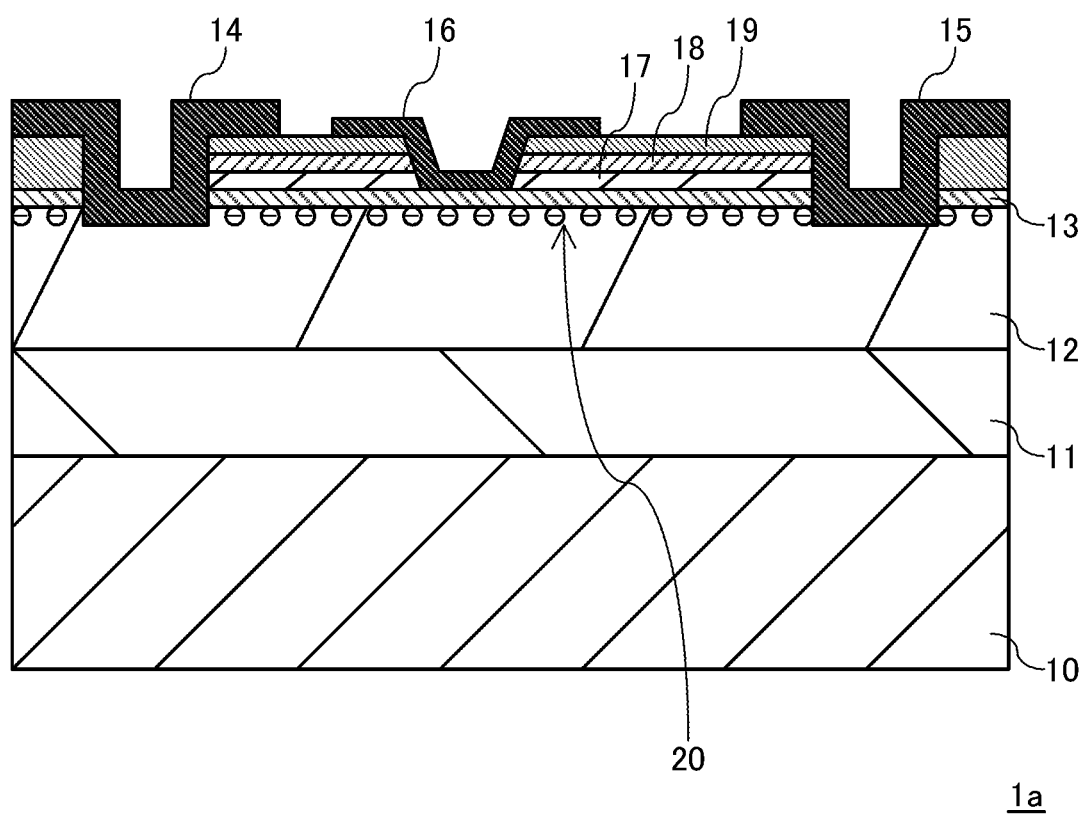
FIG. 1 is a cross-sectional view showing a structure example of a switching element according to a first embodiment of the present invention.

First, a structure example of the switching element according to the first embodiment of the present invention will be described with reference to FIG. 1. FIG. 1 is a cross-sectional view showing the structure example of the switching element according to the first embodiment of the present invention.

As shown in FIG. 1, a switching element 1a includes a substrate 10, a buffer layer 11 formed on an upper surface of the substrate 10, an electron running layer (first semiconductor layer) 12 formed on an upper surface of the buffer layer 11, an electron supplying layer (second semiconductor layer) 13 formed on an upper surface of the electron running layer 12, a source electrode (first electrode or second electrode) 14 at least partially formed on the upper surface of the electron running layer 12, a drain electrode (first electrode or second electrode) 15 at least partially formed on the upper surface of the electron running layer 12, a gate electrode (control electrode) 16 at least partially formed on an upper surface of the electron supplying layer 13 and arranged between the source electrode 14 and the drain electrode 15, a recombination layer (third semiconductor layer) 17 formed on the upper surface of the electron supplying layer 13 and arranged between the gate electrode 16 and the source electrode 14 and between the gate electrode 16 and the drain electrode 15, a clad layer (fourth semiconductor layer) 18 formed on an upper surface of the recombination layer, and a passivation layer (insulating layer) 19 formed on an upper surface of the clad layer 18. In addition, this switching element is a normally-on type.

The substrate 10 is composed of silicon, silicon carbide (SiC), or sapphire, for example. The buffer layer 11 is composed of a single layer composed of $Al_aGa_{1-a}N$ ($0 \le a \le 1$, that is, AlN when a=1, and GaN when a=0 can be included), or a laminated-layer structure (a value of "a" in each layer may differ). Any material may be applied to the substrate 10 and the buffer layer 11 as long as the switching element 1a which will be described below favorably operates.

The electron running layer 12 is composed of undoped GaN and has a thickness of 1 μm or more and 5 μm or less, for example. The electron supplying layer 13 is composed of $Al_bGa_{1-b}N$ ($0<b<1$) and has a thickness of 10 nm or more and 100 nm or less, for example. A band gap of the electron supplying layer 13 is larger than a band gap of the electron running layer 12, and a heterojunction is formed between the electron running layer 12 and the electron supplying layer 13. Thus, a two-dimensional electron gas 20 can be generated in an interface of the electron running layer 12 with the electron supplying layer 13. As for the switching element 1a in this embodiment, the two-dimensional electron gas 20 serves as a channel.

Each of the source electrode 14, the drain electrode 15, and the gate electrode 16 is composed of a metal element such as Ti, Al, Cu, Au, Pt, W, Ta, Ru, Ir, or Pd, an alloy composed of at least two of the above metal elements, or a nitride containing at least one of the above metal elements. Here, it is to be noted that each of the source electrode 14 and the drain electrode 15 forms an ohmic junction with the electron running layer 12, and the gate electrode 16 forms a schottky junction with the electron supplying layer 13. In addition, each of the source electrode 14, the drain electrode 15, and the gate electrode 16 may be composed of a single layer, or composed of a laminated-layer structure (a composition of each layer may differ).

In addition, each of the source electrode 14, the drain electrode 15, and the gate electrode 16 has a field plate structure in which one part extends on the passivation layer 19. The source electrode 14 extends toward the gate electrode 16 and an opposite side of the gate electrode 16, the drain electrode 15 extends toward the gate electrode 16 and an opposite side of the gate electrode 16, and the gate electrode 16 extends toward the source electrode 14 and the drain electrode 15.

The recombination layer 17 is composed of $In_cAl_dGa_{1-c-d}N$ having a thickness of 1 nm or more and 20 nm or less ($0<c \le 1$, $0 \le d \le 1$, that is, InN when c=1 and d=0, and $In_cGa_{1-c}N$ when c≠1 and d=0 can be included). In addition, a band gap of the recombination layer 17 is smaller than the band gap of the electron supplying layer 13.

The clad layer 18 is composed of $Al_eGa_{1-e}N$ ($0 \le e<1$, that is, GaN when e=0 can be included) and has a thickness of 5 nm or more and 30 nm or less, for example. In addition, a band gap of the clad layer 18 is larger than the band gap of the recombination layer 17. In addition, the electron supplying layer 13, the recombination layer 17, and the clad layer 18 form a double hetero structure similar to a light-emitting diode.

The passivation layer 19 is composed of AlN or SiN and has a thickness of 50 nm or more and 250 nm or less, for example. A band gap of the passivation layer 19 is larger than the band gap of the clad layer 18. In addition, an oxide or oxynitride may be applied to the passivation layer 19, but it is more preferable that the nitride such as the above-described AlN or SiN is applied. This is because when the switching element 1a is used in the power device, the potential difference such as several hundred V is generated as described above, so that it is necessary to prevent the electron running layer 12 from being electrochemically oxidized (refer to Appl. Phys. Lett. 96, 233509, (2010), for example).

The switching element 1a is switched between an on state and an off state, depending on a potential of the gate electrode 16. Hereinafter, the on state and the off state of the switching element 1a will be described with reference to FIGS. 2 and 3.

Figure 2:
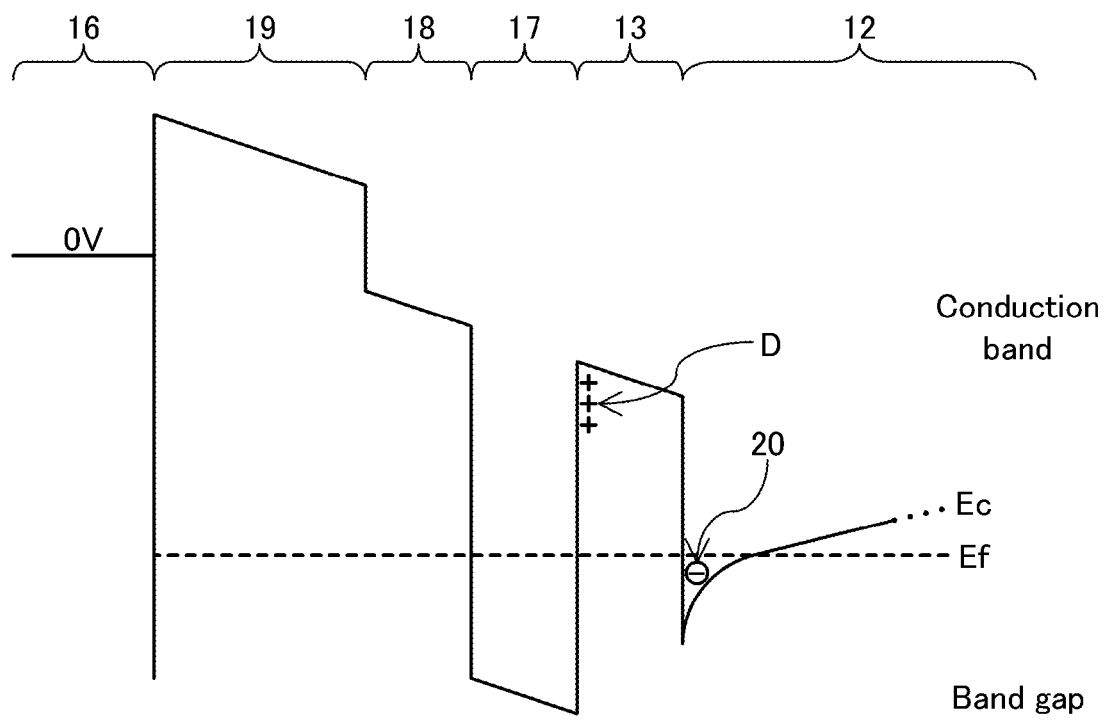
FIG. 2 is an energy band diagram in the vicinity of a gate electrode when the switching element shown in FIG. 1 is in an on state.
Figure 3:
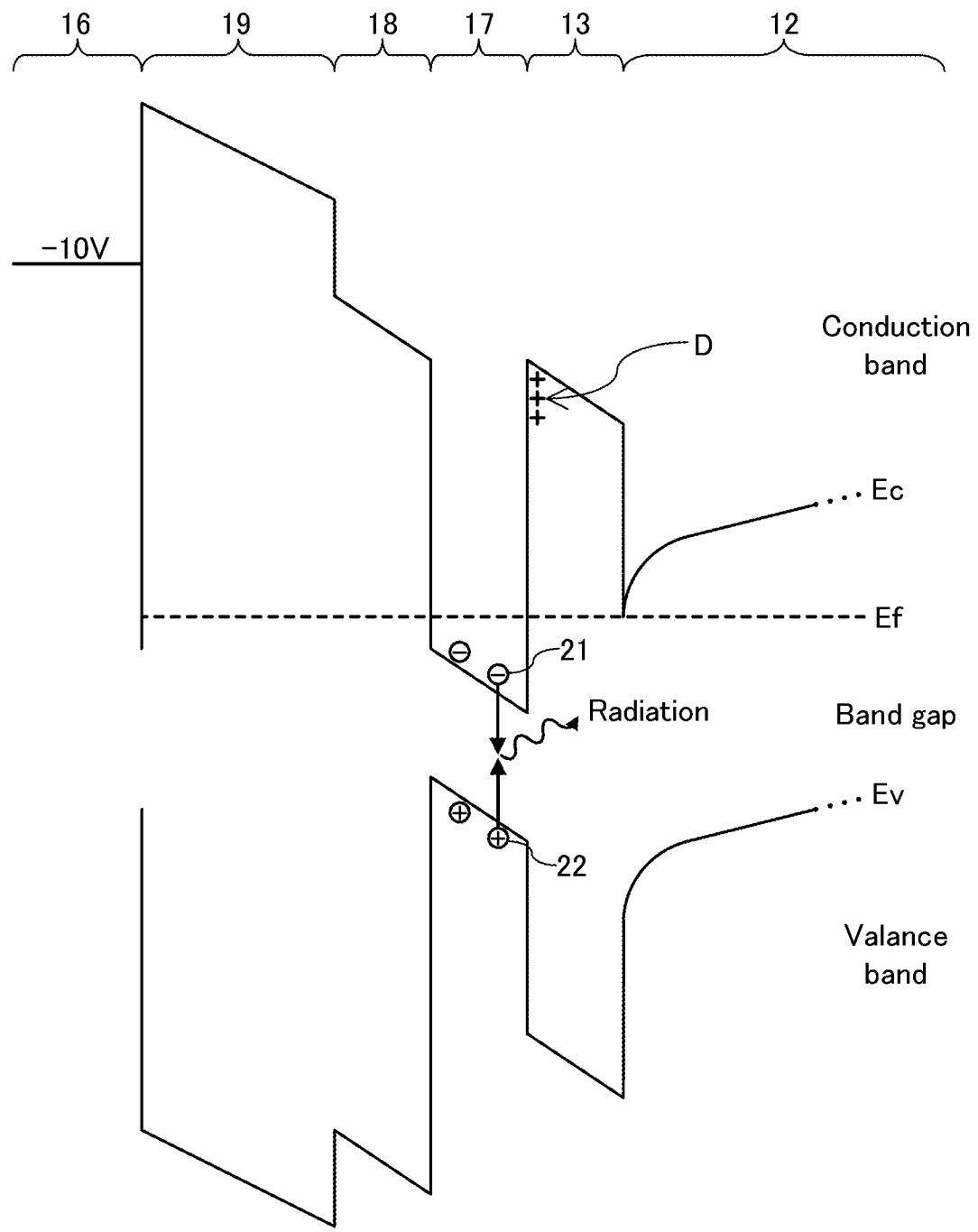
FIG. 3 is an energy band diagram in the vicinity of the gate electrode when the switching element shown in FIG. 1 is in an off state.

FIG. 2 is an energy band diagram in the vicinity of the gate electrode when the switching element shown in FIG. 1 is in the on state. FIG. 3 is an energy band diagram in the vicinity of the gate electrode when the switching element shown in FIG. 1 is in the off state. In addition, left sides in FIGS. 2 and 3 correspond to an upper side in FIG. 1, and right sides in FIGS. 2 and 3 correspond to a lower side in FIG. 1. In addition, FIGS. 2 and 3 each shows the energy band diagram in the vicinity of the gate electrode 16.

FIG. 2 shows a case where the switching element 1a is switched to the on state when the potential of the gate electrode 16 becomes equal to a potential (set to 0 V) of the source electrode 14. As shown in FIG. 2, when the switching element 1a is switched to the on state, an energy level Ec at a bottom of a conduction band becomes lower than the Fermi level Ef, in the interface of the electron running layer 12 with the electron supplying layer 13, just below the gate electrode 16. Therefore, the source electrode 14 and the drain electrode 15 are electrically connected through the two-dimensional electron gas 20 generated in this interface.

Meanwhile, FIG. 3 shows a case where the switching element 1a is switched to the off state when the potential of the gate electrode 16 reaches a value (set to a negative potential of −10 V) which is lower than the potential (set to 0 V) of the source electrode 14 by a predetermined value or more. As shown in FIG. 3, when the switching element 1a is switched to the off state, the energy level Ec at the bottom of the conduction band becomes higher than the Fermi level Ef, in the interface of the electron running layer 12 with the electron supplying layer 13, just below the gate electrode 16. Therefore, the two-dimensional electron gas 20 is not generated at least in the interface just below the gate electrode 16. Thus, the source electrode 14 and the drain electrode 15 are not electrically connected.

When the switching element 1a is switched to the off state, a high potential difference (such as about several hundred V) is generated between the drain electrode 15 and the source electrode 14. As a result, a high electric field is generated in the vicinity of the gate electrode 16, on the drain electrode 15 side, and electrons 21 and holes 22 are generated due to impact ionization. As described above, even when the passivation layer 19 is provided and the gate electrode 16 has the field plate structure, it is difficult to sufficiently prevent the electrons 21 and the holes 22 from being generated due to the impact ionization.

However, as for the switching element 1a in this embodiment, the electrons and the holes generated due to the impact ionization are collected to the recombination layer 17. Therefore, it becomes possible to considerably reduce the possibility that the electrons generated due to the impact ionization are trapped in a level D caused by the nitrogen defect on the surface (upper surface) of the electron supplying layer 13. In addition, the electrons 21 and the holes 22 collected in the recombination layer 17 are consumed due to recombination. Therefore, the electrons 21 and the holes 22 are efficiently and continuously collected in the recombination layer 17.

As described above, as for the switching element a in this embodiment, since the recombination layer 17 is provided, the electric charges (especially carriers, or electrons in this example) generated due to the impact ionization can be prevented from being trapped on the surface (upper surface) of the electron supplying layer 13. Therefore, the collapse phenomenon can be effectively prevented.

The recombination layer 17 is preferably capable of making radiative recombination of the electrons 21 and the holes 22. When the radiative recombination of the electrons 21 and the holes 22 occurs, energy generated due to the recombination becomes light and this is radiated outside, so that it is possible to prevent characteristics of the switching element 1a from being deteriorated, compared with a case where heat is generated due to non-radiative recombination.

In addition, nitride containing indium has a property of collecting the holes in the vicinity of combination of In—N, so that the radiative recombination of the electrons and the holes can be efficiently made. Therefore, when the recombination layer 17 is composed of a nitride semiconductor containing indium, the characteristics of the switching element 1a can be prevented from being deteriorated.

In addition, the buffer layer 11, the electron running layer 12, the electron supplying layer 13, the recombination layer 17, and the clad layer 18 can be formed by using various methods such as MOCVD (Metal Organic Chemical Vapor Deposition), MBE (Molecular Beam Epitaxy), and the like.

Second Embodiment

Figure 4:
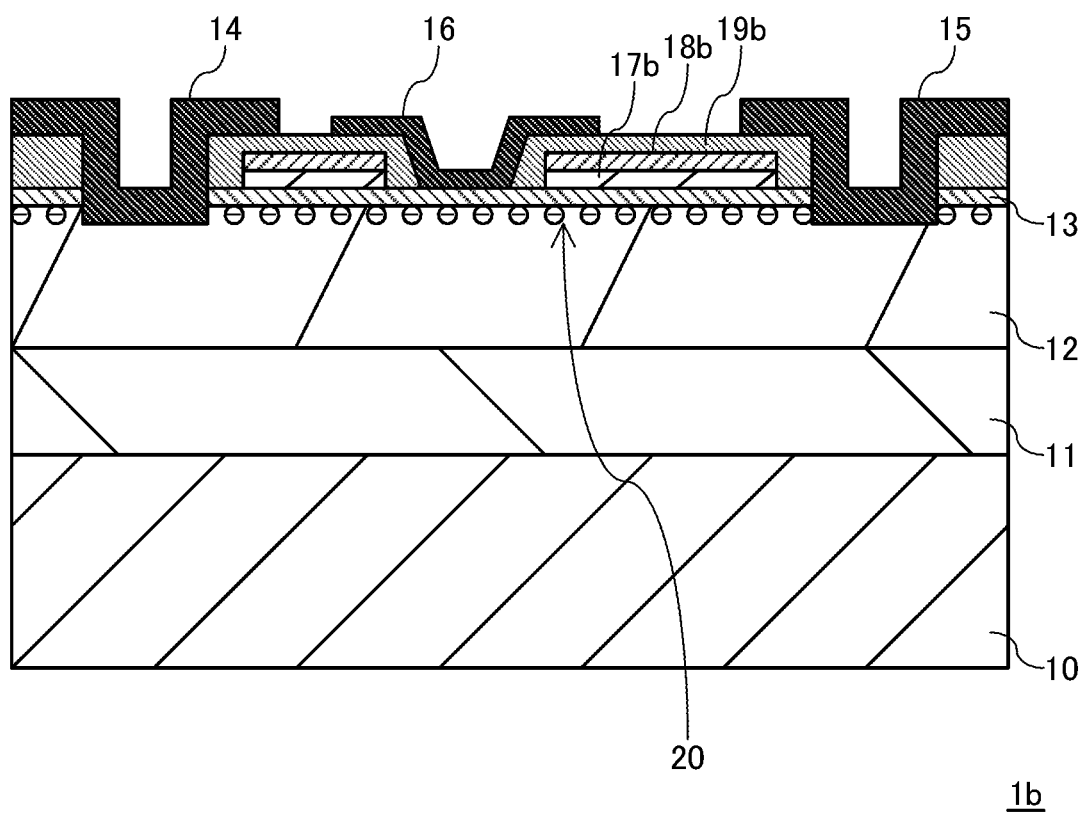
FIG. 4 is a cross-sectional view showing a structure example of a switching element according to a second embodiment of the present invention.

Next, a structure example of a switching element according to a second embodiment of the present invention will be described with reference to FIG. 4. FIG. 4 is a cross-sectional view showing the structure example of the switching element according to the second embodiment of the present invention. In addition, in FIG. 4, the same component as that of the switching element 1a according to the first embodiment shown in FIG. 1 is marked with the same reference. In addition, in a following description, a switching element 1b according to the second embodiment will be described mainly about a part different from the switching element 1a according to the first embodiment, and as for a similar part, the description of the switching element 1a according to the first embodiment is appropriately used as a reference and its description is omitted.

As shown in FIG. 4, the switching element 1b includes the substrate 10, the buffer layer 11, the electron running layer 12, the electron supplying layer 13, the source electrode 14, the drain electrode 15, the gate electrode 16, a recombination layer 17b, a clad layer 18b, and a passivation layer 19b.

Here, it is to be noted that as for the switching element 1b in this embodiment, the passivation layer 19b is formed in a space obtained by separating the recombination layer 17b and the clad layer 18b from each of the source electrode 14, the drain electrode 15, and the gate electrode 16. Except for this point, the switching element 1b in this embodiment is the same as the switching element 1a in the first embodiment shown in FIG. 1.

As described above, as for the switching element 1b in this embodiment, the passivation layer 19b composed of an insulating material is formed between the recombination layer 17b which is relatively small in band gap and low in insulating property, and each of the source electrode 14, the drain electrode 15, and the gate electrode 16. Therefore, it is possible to prevent a current from being leaked through the recombination layer 17b between the source electrode 14 and the drain electrode 15, and between the drain electrode 15 and the gate electrode 16.

Third Embodiment

Figure 5:
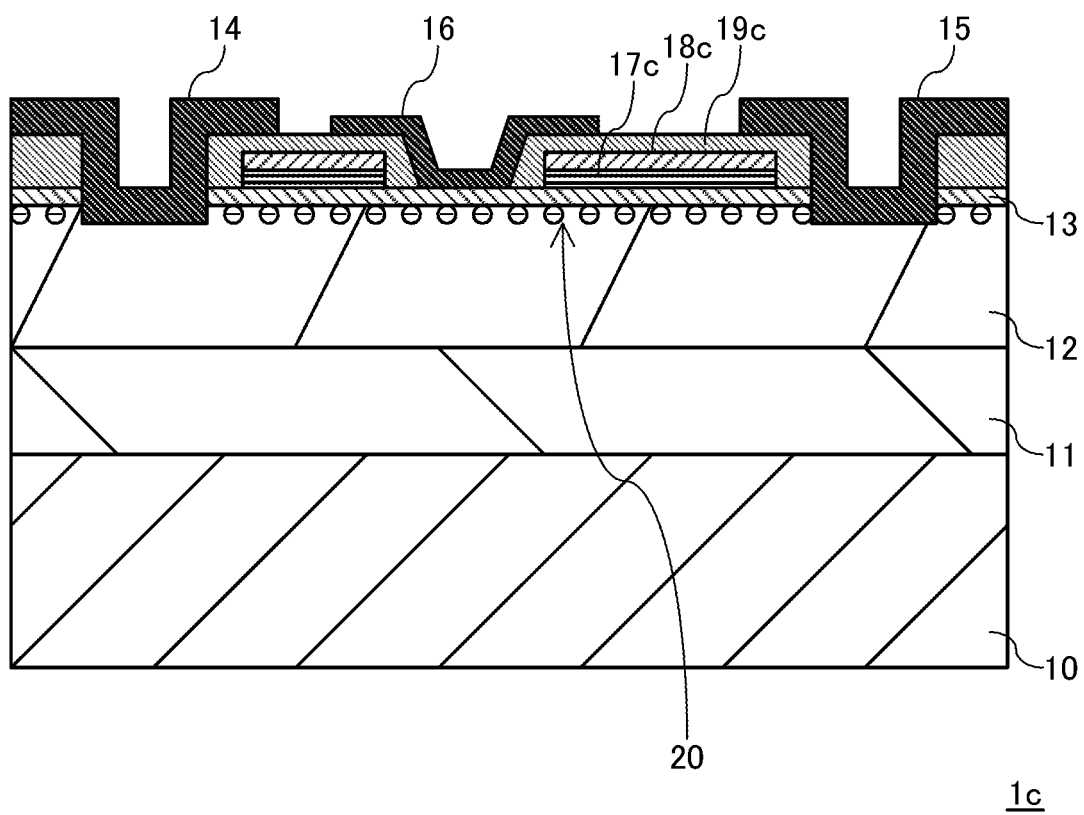
FIG. 5 is a cross-sectional view showing a structure example of a switching element according to a third embodiment of the present invention.
Figure 6:
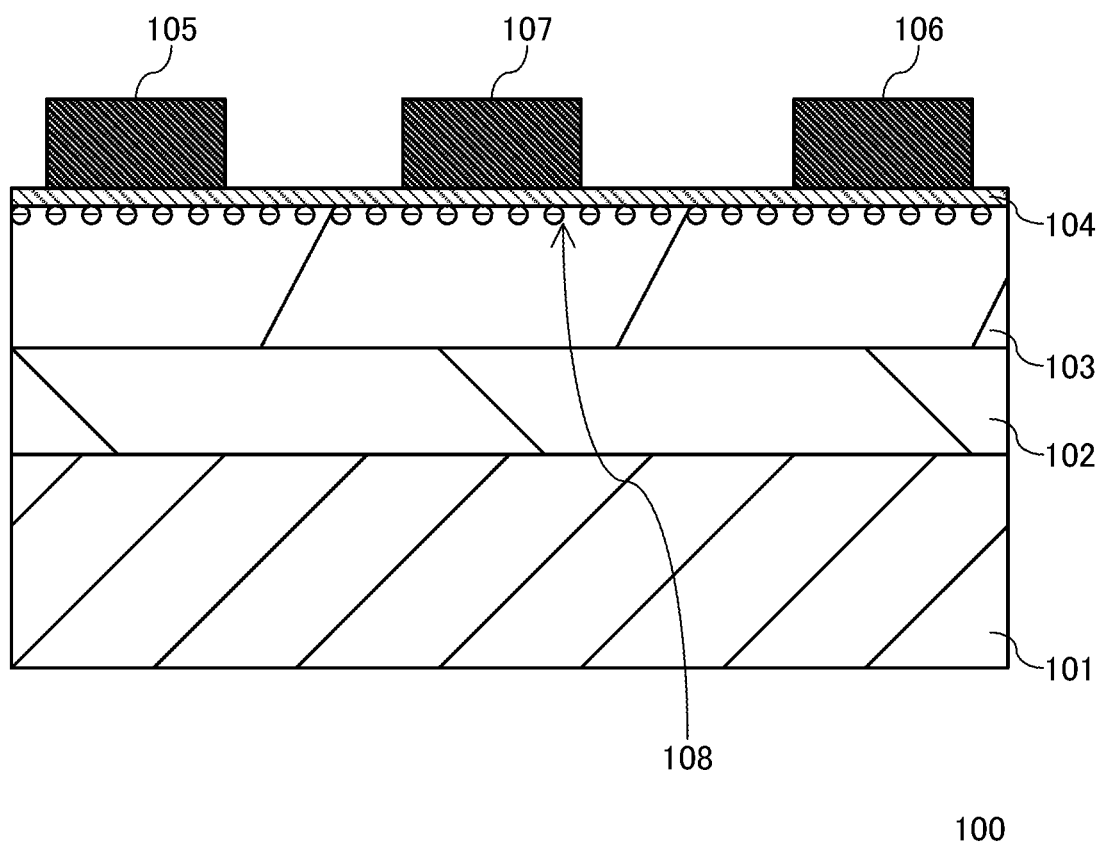
FIG. 6 is a cross-sectional view showing a structure of a conventional switching element.
Figure 7:
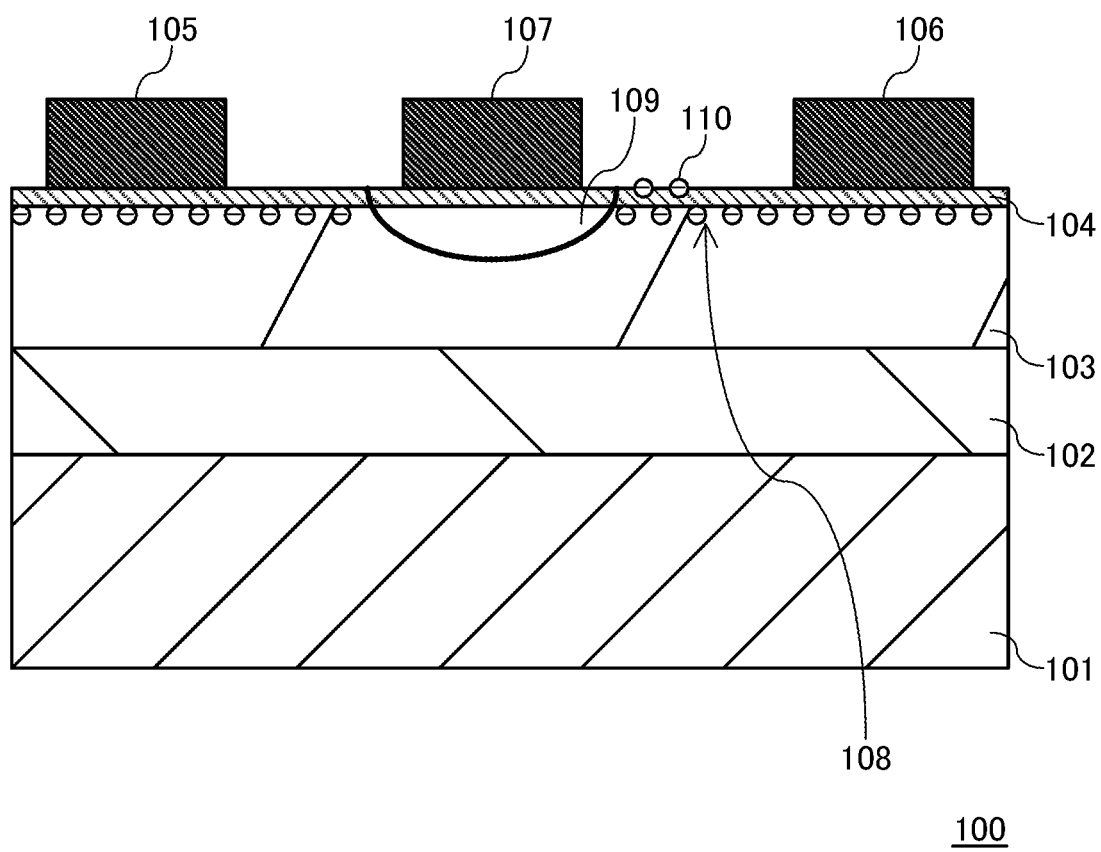
FIG. 7 is a cross-sectional view showing an off state of the conventional switching element shown in FIG. 6.
Figure 8:
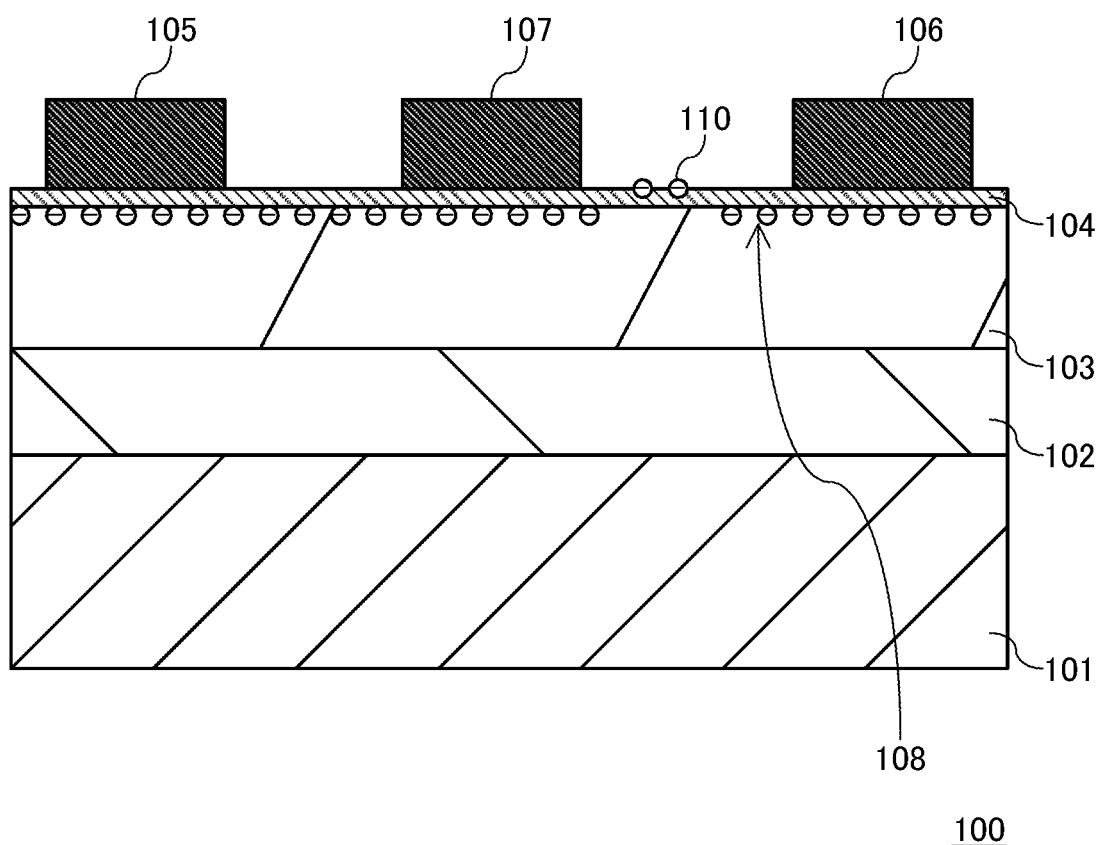
FIG. 8 is a cross-sectional view showing an on state of the conventional switching element shown in FIG. 6.
Figure 9:
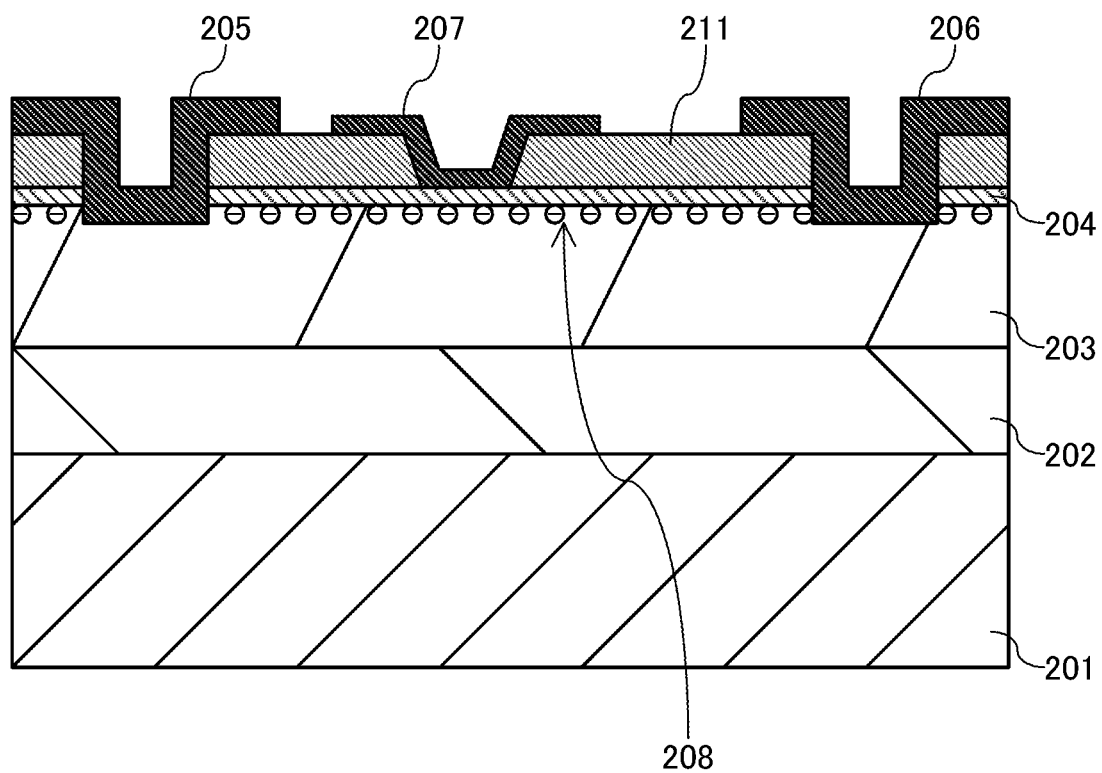
FIG. 9 is a cross-sectional view showing a structure of a conventional switching element.

Next, a structure example of a switching element according to a third embodiment of the present invention will be described with reference to FIG. 5. FIG. 5 is a cross-sectional view showing the structure example of the switching element according to the third embodiment of the present invention. In addition, in FIG. 5, the same component as that of the switching element 1a according to the first embodiment shown in FIG. 1 is marked with the same reference. In addition, in a following description, a switching element 1c according to the third embodiment will be described mainly about a part different from the switching element 1a according to the first embodiment, and as for a similar part, the description of the switching element 1a according to the first embodiment is appropriately used as a reference and its description is omitted.

As shown in FIG. 5, the switching element 1c includes the substrate 10, the buffer layer 11, the electron running layer 12, the electron supplying layer 13, the source electrode 14, the drain electrode 15, the gate electrode 16, a recombination layer 17c, a clad layer 18c, and a passivation layer 19c. Here, the switching element 1c in the third embodiment has a structure in which the passivation layer 19c is formed in a space obtained by separating the recombination layer 17c and the clad layer 18c from each of the source electrode 14, the drain electrode 15, and the gate electrode 16, which is similar to the switching element 1b according to the second embodiment. Therefore, as for this structure, the description for the switching element 1b according to the second embodiment is used as a reference, and its description is omitted.

As for the switching element 1c in this embodiment, the recombination layer 17c has a multiple quantum well structure. The multiple quantum well structure is a structure in which a barrier layer having a relatively low indium composition and a relatively large band gap, and a well layer having a relatively high indium composition and a relatively small band gap are periodically (alternately) laminated. As for the multiple quantum well structure, the electrons and the holes are two-dimensionally confined in the well layer, and the electrons and the holes have discrete energy (a sub-band is formed), so that the electrons and the holes are efficiently recombined. In addition, at the time of the radiative recombination of the electrons and the holes, a wavelength of radiated light is aligned.

As described above, as for the switching element 1c in this embodiment, the recombination layer 17c has the multiple quantum well structure. Therefore, the electrons and the holes can be efficiently recombined, and the electrons and the holes can be more effectively collected in the recombination layer 17c. Therefore, the collapse phenomenon can be more effectively prevented.

In addition, as for the recombination layer 17c, when a thickness of the well layer is 1 nm or more and 5 nm or less, and a thickness of the barrier layer is 3 nm or more and 30 nm or less, efficiency of the recombination of the electrons and the holes can be effectively enhanced, which is preferable.

In addition, the description has been given of the switching element 1c having the structure in which, the passivation layer 19c is formed in a space obtained by separating the recombination layer 17c and the clad layer 18c from each of the source electrode 14, the drain electrode 15, and the gate electrode 16 (that is, the structure of the switching element 1b according to the second embodiment), but the switching element 1c may have the structure in which the recombination layer 17c and the clad layer 18c are in contact with each of the source electrode 14, the drain electrode 15, and the gate electrode 16 (that is, the structure of the switching element 1a according to the first embodiment).

Furthermore, as for the switching elements 1a to 1c according to the first to third embodiments, each of the recombination layers 17, 17b, and 17c (especially, 17 and 17b) may be formed by a method in such a manner that each of the clad layers 18, 18b, and 18c composed of a nitride semiconductor is formed on the upper surface of the electron supplying layer 13, and then indium ions are implanted in the nitride semiconductor. With this method, the recombination layers 17, 17b, and 17c can be easily formed.

In addition, the recombination layers 17, 17b, and 17c may not be formed in the positions shown in FIGS. 1, 4, and 5, respectively, and may be formed in any positions as long as they are formed on the upper surface of the electron supplying layer 13. However, with a view of effectively preventing the collapse phenomenon, they are preferably formed on a path in which a current flows. That is, the recombination layer 17 is preferably formed at least one of the position between the gate electrode 16 and the source electrode 14, and the position between the gate electrode 16 and the drain electrode 15 (especially, the latter one is preferable).

In addition, the normally-on type switching elements 1a to 1c are illustrated in the embodiments of the present invention, but the present invention can be applied to a normally-off type switching element. In addition, the switching elements 1a to 1c in which the carrier (two-dimensional carrier gas) is the electron (two-dimensional electron gas) are illustrated in the embodiments of the present invention, but the present invention can be applied to a switching element in which the carrier (two-dimensional carrier gas) is the hole (two-dimensional hole gas, that is, 2DHG).

INDUSTRIAL APPLICABILITY

The present invention is available for a switching element, and especially available for a switching element used in a power device.

EXPLANATION OF REFERENCES 1a to 1c: Switching element
10: Substrate
11: Buffer layer
12: Electron running layer
13: Electron supplying layer
14: Source electrode
15: Drain electrode
16: Gate electrode
17, 17b, 17c: Recombination layer
18, 18b, 18c: Clad layer
19, 19b, 19c: Passivation layer
20: Two-dimensional electron gas
21: Electron
22: Hole

The invention claimed is:
1. A switching element comprising:
a first semiconductor layer;
a second semiconductor layer formed on an upper surface of the first semiconductor layer, having a band gap larger than that of the first semiconductor layer, and forming a heterojunction with the first semiconductor layer;
a third semiconductor layer formed on an upper surface of the second semiconductor layer and having a band gap smaller than that of the second semiconductor layer;
a fourth semiconductor layer formed on an upper surface of the third semiconductor layer and having a band gap larger than that of the third semiconductor layer;
a first electrode having at least one part formed on the upper surface of the first semiconductor layer;
a second electrode having at least one part formed on the upper surface of the first semiconductor layer; and
a control electrode having at least one part formed on the upper surface of the second semiconductor layer and arranged between the first electrode and the second electrode, wherein the switching element is switched, depending on a potential of the control electrode, between
an on state in which the first electrode and the second electrode are electrically connected through a two-dimensional carrier gas generated in an interface of the first semiconductor layer with the second semiconductor layer, and
an off state in which the first electrode and the second electrode are not electrically connected as no two-dimensional carrier gas is generated in the interface, at least just below the control electrode,
wherein recombination of electrons and holes is made in the third semiconductor layer when the off state is provided,
wherein the switching element further comprises an insulating layer formed on an upper surface of the fourth semiconductor layer and having a band gap larger than that of the fourth semiconductor layer,
wherein the insulating layer is formed in a space obtained by separating the third semiconductor layer and the fourth semiconductor layer from each of the control electrode, the first electrode, and the second electrode, and
wherein the third semiconductor layer has a multiple quantum well structure.

2. The switching element according to claim 1, wherein the third semiconductor layer is formed at least one of a position between the control electrode and the first electrode, and a position between the control electrode and the second electrode.

3. The switching element according to claim 1, wherein radiative recombination of the electrons and the holes is made in the third semiconductor layer when the off state is provided.

4. The switching element according to claim 1, wherein
each of the first semiconductor layer, the second semiconductor layer, and the third semiconductor layer is composed of a nitride semiconductor,
the two-dimensional carrier gas is a two-dimensional electron gas, and
the third semiconductor layer contains indium.

5. The switching element according to claim 4, wherein the third semiconductor layer is composed of $In_xAl_yGa_{1-x-y}N$ ($0<x\leq1$, $0\leq y\leq1$).

6. The switching element according to claim 4, wherein the multiple quantum well structure comprises at least two nitride semiconductor layers having different indium compositions laminated periodically.

7. The switching element according to claim 4, wherein the third semiconductor is formed in such a manner that a layer composed of a predetermined nitride semiconductor is formed on the upper surface of the second semiconductor layer, and then indium ion is implanted to the layer.

8. The switching element according to claim 1, wherein the fourth semiconductor layer is composed of $Al_zGa_{1-z}N$ ($0\leq z<1$).

9. The switching element according to claim 1, wherein the insulating layer is composed of AlN or SiN.

10. A switching element, comprising:
a first semiconductor layer;
a second semiconductor layer formed on an upper surface of the first semiconductor layer, having a band gap larger than that of the first semiconductor layer, and forming a heterojunction with the first semiconductor layer;
a third semiconductor layer formed on an upper surface of the second semiconductor layer and having a band gap smaller than that of the second semiconductor layer;
a first electrode having at least one part formed on and in contact with the upper surface of the first semiconductor layer;
a second electrode having at least one part formed on and in contact with the upper surface of the first semiconductor layer; and
a control electrode having at least one part formed on the upper surface of the second semiconductor layer and arranged between the first electrode and the second electrode,
wherein the switching element is switched, depending on a potential of the control electrode, between
an on state in which the first electrode and the second electrode are electrically connected through a two-dimensional carrier gas generated in an interface of the first semiconductor layer with the second semiconductor layer, and
an off state in which the first electrode and the second electrode are not electrically connected as no two-dimensional carrier gas is generated in the interface, at least just below the control electrode,
wherein recombination of electrons and holes is made in the third semiconductor layer when the off state is provided, and
wherein the third semiconductor layer has a multiple quantum well structure.

11. The switching element according to claim 10, further comprising a fourth semiconductor layer formed on and in contact with an upper surface of the third semiconductor layer and having a band gap larger than that of the third semiconductor layer.

* * * * *